United States Patent [19]

MacInnis et al.

[11] Patent Number: 5,432,446
[45] Date of Patent: Jul. 11, 1995

[54] BOREHOLE MEASUREMENT OF NMR CHARACTERISTICS OF EARTH FORMATION

[75] Inventors: Jason P. MacInnis; Don T. Macune, both of Houston; Christopher E. Morriss, The Woodlands; Richard W. Oldigs, Huffman; John E. Smaardyk, Houston; Joseph M. Steiner, Jr., Austin, all of Tex.

[73] Assignee: Schlumberger Technology Corporation, Houston, Tex.

[21] Appl. No.: 219,860

[22] Filed: Mar. 29, 1994

Related U.S. Application Data

[63] Continuation of Ser. No. 970,324, Nov. 2, 1992, abandoned.

[51] Int. Cl.⁶ ............................................. G01R 33/20
[52] U.S. Cl. ................................................... 324/303
[58] Field of Search ............... 324/300, 303, 307, 318, 324/319, 320, 322; 128/653.5

[56] References Cited

U.S. PATENT DOCUMENTS

| | | | |
|---|---|---|---|
| 3,617,867 | 11/1971 | Herzog | 324/303 |
| 4,350,955 | 9/1982 | Jackson et al. | 324/303 |
| 4,646,016 | 2/1987 | Brown | 324/303 |
| 4,710,713 | 12/1987 | Stikman | 324/303 |
| 4,714,881 | 12/1987 | Givens | 324/303 |
| 4,717,876 | 1/1988 | Masi et al. | 324/303 |
| 4,717,877 | 1/1988 | Taicher et al. | 324/303 |
| 4,717,878 | 1/1988 | Taicher et al. | 324/303 |
| 4,933,638 | 6/1990 | Kenyon et al. | 324/303 |
| 5,055,787 | 10/1991 | Kleinberg et al. | 324/303 |
| 5,055,788 | 10/1991 | Kleinberg et al. | 324/303 |

FOREIGN PATENT DOCUMENTS

WO92/10768  6/1992  WIPO.

OTHER PUBLICATIONS

"Spin Echo Magnetic Resonance Logging: Porosity and Free Fluid Index Determination" SPE 20561, pp. 321-332.

Primary Examiner—Sandra L. O'Shea
Assistant Examiner—Raymond Y. Mah
Attorney, Agent, or Firm—Henry N. Garrana

[57] ABSTRACT

NMR logging apparatus is provided which produces a strong, static and homogeneous magnetic field $B_0$ in a Volume of an adjacent formation on one side of the tool to measure nuclear magnetic resonance characteristics thereof at two different depths of investigations. In the preferred embodiment, the tool has an RF antenna mounted on the outside of the metal body of the tool, directing focused oscillating magnetic fields $B_1$ at said Volume to polarize or tip the magnetic moments of hydrogen nuclei of fluids within rock pores. The same antenna can be used to receive signals of proton precession in the Volume of interest immediately after transmission of the RF polarizing field $B_1$. One of the NMR readings is employed to compensate for inaccuracies in the other NMR reading to provide an overall improved NMR log.

26 Claims, 2 Drawing Sheets

BOREHOLE MEASUREMENT OF NMR CHARACTERISTICS OF EARTH FORMATION

This is a continuation of application Ser. No. 07/970,324, filed Nov. 2, 1992, (now abandoned).

FIELD OF THE INVENTION

This invention relates to apparatus and techniques for making nuclear magnetic resonance (NMR) measurements in boreholes, and to methods for determining magnetic characteristics of formations traversed by a borehole.

BACKGROUND OF THE INVENTION

Repeated attempts have been made to use the principles of nuclear magnetic resonance by means of logging tools lowered through boreholes in oil exploration over the past several decades. It is recognized that particles of a formation having magnetic spin, for example atomic nuclei, protons, or electrons, have tendencies to align with a magnetic field which is imposed on the formation. Such a magnetic field may be naturally generated, as is the case with the earth's magnetic field ($B_E$) which has an intensity of approximately 0.5 gauss in areas of the globe where boreholes are typically drilled. Any given particle in a formation is additionally influenced by localized magnetic fields associated with nearby magnetic particles, other paramagnetic materials, and the layer of ions which typically line pore walls of certain types of formations such as shales. These localized fields tend to be inhomogeneous, while the earth's magnetic field is relatively homogeneous.

Useful apparatus have been provided which produce a static and substantially homogeneous magnetic field focussed into a formation on one side of a logging tool. By directing and configuring the combined magnetic fields of a configuration of magnets, a region, remote from the configuration of magnets, is produced wherein the spatial field gradient substantially vanishes, thereby insuring that the field is highly homogeneous throughout that region. In a preferred form, the magnets are mounted within a metallic skid or logging pad, the static magnetic field is directed through the face of the pad into an adjacent formation, and the region of substantially homogeneous field is situated in a volume of formation behind the mudcake layer which typically lines borehole walls. A homogeneous magnetic field one thousand times stronger than the earth's magnetic field can be thus imposed, or "focused", on a volume of formation in situ. Reference may be had to U.S. Pat. No. 4,933,638 issued Jun. 12, 1990 to Kenyon, et al for details of such an apparatus, which patent is incorporated herein by reference.

In the Kenyon et al patent an RF antenna is mounted on the outside of the structure of the pad so that the pad serves as a natural shield against any signals which may be generated by resonant conditions behind the pad, particularly those potentially strong resonance signals from borehole fluid. In the preferred form, the antenna is configured to focus its signals radially outwardly from the pad face, into the volume of formation having the homogeneous field, thereby additionally reducing the distortion of measured signals from borehole effects.

While the prior logging tools of Kenyon, et al have been capable of determining formation characteristics with sufficient accuracy and dependability, it has been found useful to improve their performance and accuracy in view of the inherent difficulties of making NMR measurements in boreholes.

Accordingly, it is an object of the present invention to provide improved apparatus and methods for determining nuclear magnetic characteristics of earth formations more accurately and more dependably.

It is an additional object of the invention to provide apparatus and methods to determine the nuclear magnetic relaxation time, the free fluid porosity, permeability and related pore fluid characteristics of earth formations traversed by a borehole at two different depths of investigation into the formations surrounding the borehole.

It is also an object of the invention to provide borehole apparatus for measuring magnetic resonance in which all pulse parameters are controlled so as to operate repeatedly in borehole conditions with high reliability and accuracy.

It is a further object of the invention to provide a magnet configuration for NMR measurements in a logging borehole which is easily and conveniently tested, calibrated and compensated for temperature variations.

It is also an object of the invention to provide a magnetic resonance logging tool which directly measures the transverse and longitudinal relaxation times of formations traversed by a borehole.

In another aspect of the invention, it is an object to provide improved methods for determining the permeability and like parameters from measured longitudinal "$T_1$" and transverse "$T_2$" relaxation times signals of NMR logging tools.

It is also an object of the invention to provide improved methods for determining the nuclear magnetic relaxation times of a measured population of particles in earth formations surrounding a borehole.

SUMMARY OF THE INVENTION

In accordance with a preferred form of the invention two sets of NMR signal generators and detectors are provided in spaced apart relationship along the direction of elongation of an NMR logging tool. Each set comprises an elongated trough antenna provided on a pad face, parallel to the borehole axis and to an elongated volume of substantially homogeneous static magnetic field generated by permanent magnets in the adjacent formation. It is preferable for the permanent magnets to be as large as possible given the constraints of the borehole dimensions. By superposing the geometric shape of the volume of homogeneous and static field with the pattern of the RF field from the antenna, near optimum resonance conditions can be created for each of the sets. In the preferred embodiment the static field is directed radially into said volume, while the RF field is circumferentially directed and thus perpendicular to the static homogeneous field within the volume of investigation. The length of the trough antenna is preferably about equal to the length of the volume of investigation. To obtain two different depths of investigations one of the sets includes an unique disposition for it's pair of permanent magnets that pushes the volume of investigation deeper into the formation.

In accordance with the present invention, methods and apparatus are provided for making fast pulsed measurements of magnetic resonance in earth formations surrounding a borehole in a manner in which the pulse parameters are highly controlled.

In accordance with a further aspect of the invention, the transmitting antenna is also used for receiving magnetic resonance signals, and special circuitry is used to very rapidly damp the ringing current which occurs in the antenna after a power shut-off. The special circuitry, called a Q-Switch, damps the polarizing antenna current about 1000 times faster than the previous tool, and enables many pulses to be injected successively into a formation in a short period of time.

By vastly increasing the number of measurement cycles per unit time, the present invention enables the logging tool to: (1) increase the signal-to-noise ratio (S/N) of the overall measured data set, thereby permitting either a faster logging rate or continuous logging, and (2) reduce the NMR measurement time during which nuclei may diffuse within rock pores, thereby reducing the undesirable magnetic effects of such diffusion.

In accordance with another aspect of the invention, additional apparatus is provided in generating the RF signal, and specifically a tunable frequency synthesizer is provided to compensate for magnet temperature variations. Advantageously, a digital control of frequency synthesis is provided to maintain phase relationships with temperature changes.

In accordance with yet another aspect of the invention, a small calibration loop attached parallel to the wall-engaging face of the tool is driven by a constant current RE source. This configuration serves to significantly reduce or eliminate such undesirable signals as temperature and near antenna conductivity effects by providing active and relative calibration for the NMR measurement.

In another aspect of the invention, apparatus and methods are provided for quadrature detection of the measured nuclear magnetic resonance signals to determine the values of formation pore fluid characteristics such as permeability.

DESCRIPTION OF PREFERRED EMBODIMENTS

Figures 1, 2, 3:
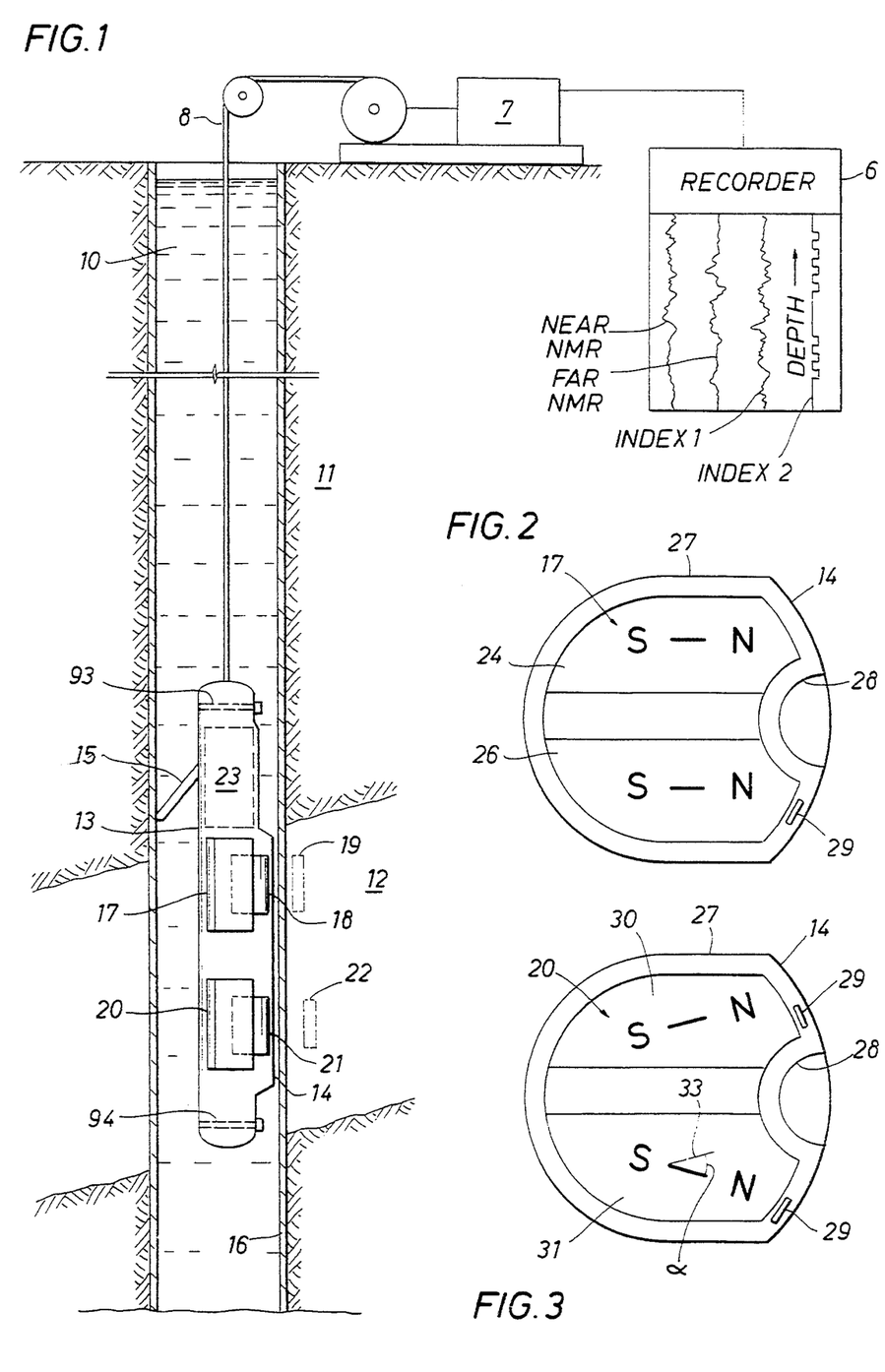
FIG. 1 is a side view of a NMR logging tool positioned in a borehole for making measurements of surrounding formations, in accordance with the present invention.
FIG. 2 is an enlarged cross-sectional plan view of a first magnet array used in the preferred embodiment of the present invention shown in FIG. 1.
FIG. 3 is an enlarged cross-sectional plan view of a second magnet array used in the preferred embodiment of the present invention shown in FIG. 1.

Referring to the drawings and particularly FIG. 1 thereof, a borehole 10 is shown adjacent to formations 11, 12, the characteristics of which are to be determined. Within borehole 10 there is shown a logging tool 13 connected via a wireline 8 to surface equipment 7 including a recorder 6. Tool 13 preferably has a face 14 shaped to intimately contact the borehole wall, with minimal gaps or standoff. The tool 13 also has a retractable arm 15 which can be activated to press the body of the tool 13 against the borehole wall during a logging run, with the face 14 pressed against the wall's surface.

Although tool 13 is shown in the preferred embodiment of FIG. 1 as a single body, the tool may obviously comprise separate components such as a cartridge, sonde or skid, and the tool may be combinable with other logging tools as would be obvious to those skilled in the art. Similarly, although wireline 8 is the preferred form of physical support and communicating link for the invention, alternatives are clearly possible, and the invention can be incorporated in a drill stem, for example, using forms of telemetry which may not require a wireline. Surface equipment would include digital computers for processing data and controlling the logging operations as described in U.S. Pat. No. 5,051,962 to Eaton which is incorporated herein by reference.

The formations 11, 12 have distinct characteristics such as formation type, porosity, permeability and oil content, which can be determined from measurements taken by the tool. Deposited upon the borehole wall of formations 11, 12 is typically a layer of mudcake 16 which is deposited thereon by the natural infiltration of borehole fluid filtrate into the formations.

In the preferred embodiment shown in FIG. 1, tool 13 comprises a first set magnet array 17 and an antenna 18 positioned between the array 17 and the wall engaging face 14. Magnet array 17 produces a static magnetic field $B_0$ in all regions surrounding the tool 13. The antenna 18 produces, at selected times, an oscillating magnetic field $B_1$ which is focussed into formation 12, and is superposed on the static field $B_0$ within those parts of formation opposite the face 14. The Volume of Investigation, 19, of the tool for that first set array 17 shown in dotted lines FIG. 1, is a vertically elongated region directly in front of tool face 14 in which the magnetic field produced by the magnet array 17 is substantially homogeneous and the spatial gradient thereof is approximately zero. The tool 13 further comprises a second set magnet array 20 and an antenna 21 positioned between the array 20 and the wall engaging face 14. Magnet array 20 produces another static magnetic field $B_0$ in all regions surrounding the tool 13. The antenna 21 produces, at selected times, an oscillating magnetic field $B_1$ which is again focussed into formation 12, and is superposed on the static field $B_0$ within those parts of formation opposite the face 14. The Volume of Investigation 22 of the tool for that second set array 19, shown in dotted lines in FIG. 1, is a vertically elongated region directly in front of tool face 14 in which the magnetic field produced by the magnet array 20 is substantially homogeneous and the spatial gradient thereof is approximately zero. Due to the particular magnet arrangement for the second set magnet array 20, the volume of Investigation 22 is at a depth in the formation 12 which is greater than the depth at which the Volume of Investigation 19 is located.

A prepolarizing magnet 23, shown in dotted lines, may be positioned directly above the array 17 in a modified embodiment of the invention in accordance with the teachings of the aforementioned Kenyon, et al patent.

The tool 13 makes a measurement in the Volume of Investigation 19 by magnetically reorienting the nuclear spins of particles in formation 12 with a pulse of oscillating field $B_1$, and then detecting the precession of the tipped particles in the static, homogeneous field $B_0$ within the Volume of Investigation 19, over a period of time. As seen in FIG. 1, this Volume of Investigation does not overlap the surface of the wall engaging face 14 as in some previous logging tools, and does not overlap the mudcake 16 on the borehole wall.

In a pulse echo type of measurement a pulse of RF current is passed through the antenna 18 to generate a pulse of RF field $B_1$ where the RF frequency is selected to resonate only hydrogen nuclei subjected to a static field strength equal or nearly equal to the field $B_0$ within the Volume of Investigation 19. The signals induced in antenna 18 subsequent to the RF pulse represent a measurement of nuclear magnetic precession and decay within the Volume 19, automatically excluding any undesirable contributions from the borehole fluid, mudcake, or surrounding formations where the field strength of $B_0$ is substantially different.

The tool 13 makes a measurement in the Volume of Investigation 22 in the same manner discussed above but utilizing the second set magnet array 20 and the antenna 21.

Referring to FIGS. 1 and 2 the first set magnet array 17 consists of two samarium cobalt permanent magnets 24 and 26, which are mounted parallel to each other within a metal alloy body 27. Magnets 24, 26 are elongated and arranged so as to be parallel to the axis of the borehole when used. Each measures about 12 inches in length in the preferred embodiment. The magnetic poles of the magnets are not on the smallest faces of the slab, commonly viewed as the ends of a bar magnet; instead, the poles appear on the two opposing elongated edges of the slab magnet and point to the left and right, respectively, in both FIG. 1 and FIG. 2. Thus, within the formation 12, the magnetic field $B_0$ surrounding the magnets remains fairly constant along the longitudinal direction of the borehole axis.

Magnets 24 and 26 should be as strong as practical, and should be capable of withstanding physical shock without disintegration. The samarium cobalt magnets that have been used, for example, are preferably enclosed in a sturdy or stainless steel casing to prevent any explosive fragmentations in the event the magnet cracks or breaks and to protect magnet material from contact with formation fluids. These magnets are commercially available, and have a residual induction of typically 10,500 gauss. It would be obvious to those skilled in the art that other magnets may be substituted for the samarium cobalt magnets herein, and the slab magnets can have other dimensions than that shown in the preferred embodiment.

It is preferable to use elongated slab magnets to produce a static field in formation 12 which is constant over a substantial distance L along the z coordinate parallel to the borehole axis. A large L improves signal-to-noise ratio and also facilitates continuous logging along the z coordinate. However, the magnets should not be so long as to make the tool 13 structurally unwieldy or to cause excessive standoff between the face 14 and the borehole wall in washed out zones.

Magnets 24 and 26 are symmetrically mounted in the two sides of the body 27 with the north poles facing the same directions. As shown in FIG. 2, the north poles of magnets 24 and 26 point in the direction of the face 14 of the tool.

By configuring the two N poles of magnets 24 and 26 to point at the face 14 and the formation 12 lying beyond, magnet array 17 would appear at a great distance like a magnetic N pole. At intermediate distances, this preferred configuration of magnet array 17 produces an interesting and important field anomaly within a uniquely defined volume directly in front of the tool face 14 in which the magnetic field is substantially constant, and wherein the spatial gradient of $B_0$ is substantially reduced. This is the primary resonance region for NMR measurements and is the Volume of Investigation 19 shown in FIG. 1. To help better shape and focus the magnetic field in the longitudinal direction, pieces of permeable steel or shims 29 are positioned at appropriate locations in the body 27 s shown in FIGS. 2 and 3 by way of example. The placement of these shims 29 is experimentally determined and may vary from tool to tool.

The volume of greatest field homogeneity is centered about a point approximately one inch away from the wall engaging face 14 for the particular embodiment described. This volume of substantially homogeneous field can be shifted either a greater or less distance into the formation, depending on the relative separation distance and size of magnets 24 and 26. However, it would appear useful to utilize the largest, and therefore more powerful, magnets possible given the dimensional constraints of the body 27 whose diameter is selected to be relatively small so as to pass through a substantial number of boreholes and not just the large ones. This selection of magnet size, separation distance and diameter of body 27 is such that the volume of investigation 19 is shifted further into the formation, to avoid obtaining undesirable resonance signals from the mudcake. However, in the preferred embodiment shown in the figures, the positioning of the volume 19 is selected at a depth that avoids any substantial overlap with the relatively thin mudcake layer of typical boreholes while still providing improved signal-to-noise ratio for the NMR measurement. It can be appreciated that the size of the Volume of Investigation 19 can depend on the nature of the measurement that is taken and the strength of a RF pulse that is transmitted by the antenna 18 as explained herein below.

The metal body 27 has, on the front face 14 thereof, a semi-cylindrically shaped cavity or slot 28 which faces formations engaged by the face 14. The cavity 28 is adapted for receiving the RF antenna 18, as will be further described below. It is already clearly seen however, that antenna 18 is positioned outside of the metal body 27 of the tool, and preferrably in an oil filled pressure balanced enclosure, and is automatically shielded from electromagnetic communication with regions of the borehole which lie behind the body 27, or regions of the formations in directions intercepted by the body 27, or regions of other formations in directions intercepted by the body 27. Antenna 18 is thus responsive only to magnetic fields originating in front of the wall engaging face 14, e.g. fields originating in the formation 12 or in the mudcake or mud which contacts face 14 in the vicinity of the antenna 18. By utilizing the relative geometric positioning of the antenna and the metal body 27, it is possible to minimize undesirable signal contributions which would otherwise be difficult to eliminate by other means. In the preferred embodiment, body 27 is made of metal alloy sheathing, rigidly attached to interior metal bracing, which envelops most components of the tool other than the antenna 18, including the circuitry, the magnet array 17, and the hydraulics system of the arm 15. It is also possible for the body 27 to be constructed of other combinations of materials such as composite resins, steel, etc., as long as the overall structure is sufficiently strong, and the magnetic field of the magnet array 17 can penetrate and enter the adjoining formation 12.

Antenna 18 is used both as a RF transmitter to produce a polarizing magnetic field in formation 12, and as a receiving antenna to detect coherent magnetic signals emanating from precessing protons immediately after the polarizing field is terminated. Antenna 18 should be constructed of one or more current carrying loops which are highly efficient in generating magnetic fields in the formation. It is preferably made of a current loop which produces an oscillating field $B_1$ within the volume of investigation which is perpendicular to $B_0$. Other current loop orientations may be useful in other embodiments of the invention having a static field $B_0$ differing from that of the preferred magnet array 17.

Antenna 18 is attached to body 27 and fitted within the slot 28. Its efficiency can be ideally maximized when the current density within the slot 28 is made uniform. In practice, optimum antenna efficiency is difficult to achieve, because of various electromagnetic parasitic effects like the "skin effect", the mutual inductive effects between distinct current loops, and electrical effects within individual conductors. The preferred antenna 18 pursuant to the invention comprises a single current loop, in the shape of a trough or slot, as shown in FIG. 9 of the aforementioned Kenyon, et al patent.

Referring to FIGS. 1 and 3 the second set magnet array 20 also consists of two samarium cobalt permanent magnets 30 and 31 are also elongated in the direction longitudinally of the borehole, and measure 12 inches in the preferred embodiment. The magnetic poles of the magnets appear on the two opposing edges of the slab magnet and point to the left and right, respectively, in both FIG. 1 and FIG. 3 similar to the first set magnet array 17. thus, within the formation 12, the magnetic field $B_0$ surrounding the magnets remains fairly constant along the longitudinal direction of the borehole axis.

Magnets 30 and 31 similarity to magnets 24 and 26, should be as strong as practical. The samarium cobalt magnets that have been used, for example, are again preferably enclosed in a sturdy stainless steel casing and have a residual induction of typically 10,500 gauss.

It is preferable to use elongated slab magnets to produce a static field in formation 12 which is constant over a substantial distance L along the z coordinate parallel to the borehole axis. A large L improves signal-to-noise ratio and also facilitates continuous logging along the z coordinate. Again, the magnets should not be so long as to make the tool 13 structurally unwieldy or to cause excessive standoff between the face 14 and the borehole wall in washed out zones. Permeable steel shims 29 are employed as necessary on the face of the magnets 24, 26, 30, 31 to shape a more longitudinally uniform field.

Magnets 30 and 31 are also symmetrically mounted in the two sides of the body 27 with the north poles, however, while facing the same directions having their magnetic axes rotated slightly apart. As shown in FIG. 3 the north poles of magnets 30 and 31 point in the direction of the face 14 of the tool but with the south-north axis of the magnets forming an acute angle alpha of about 10 to 30 degrees with respect to each other at a point behind the south poles of the magnets. The dashed line 33 in FIG. 3 illustrates a line parallel to the south-north axis of magnet 30.

By configuring the two N poles of magnets 30 and 31 to point at the face 14 and the formation 12 lying beyond, magnet array 20 would also appear at a great distance like a magnetic N pole. At intermediate distances, this preferred configuration of magnet array 20 produces again a uniquely defined volume directly in front of the tool face 14 in which the magnetic field is substantially constant, and wherein the spatial gradient of $B_0$ substantially vanishes. This is the primary resonance region for NMR measurements and is the Volume of Investigation 22 shown in FIG. 1.

Although the volume of greatest field homogeneity is centered about a point approximately one inch away from the wall engaging face 14, for the parallel arrangement magnets 24 and 26, this volume of substantially homogeneous field is shifted a greater distance into the formation, due to the relative "angled" or "splayed" positioning of direction of magnetization of magnet 30 with respect to that direction for magnet 31. This shifting of the Volume of Investigation 22 deeper into the formation is made such that the volume of greatest field homogeneity is centered about a point approximately 1.5 inch away from the wall engaging face 14. This shifting has the merit that the Volume of Investigation 22 is itself shifted further into the formation, to avoid obtaining undesirable resonance signals from the mudcake in boreholes having high rugosity or an extremely thick mudcake or solids invasion or shallow drilling-induced defects. It can be appreciated that the size of the volume of Investigation 22 can depend on the nature of the measurement that is taken and the strength of a RF pulse that is transmitted by the antenna 21 as explained above with respect the first array antenna 18. The mounting and operation of the antenna 21 is substantially similar to that of the antenna 18 and therefore reference may be had to that first set structure for details of the second set structure. Of course the reverse is also true. The Volume of Investigation can be shifted closer to the wall engaging face 14 by having the direction of magnetization of the two magnets 30 and 31 converging towards a point in front of the north poles of the magnets. This may be useful in providing a direct measurement of the fluid or mud in the borehole or invaded zone.

The advantage of the embodiment shown in FIG. 1 with two sensors with different depth of investigation leads to a marked improvement in the quality and confidence in the measurement. The deeper sensor antenna 21 would be expected to yield more statistically reliable results since it would be less likely to be affected by degradations due for example, by borehole rugosity, drilling-induced formation damage, thick mudcake, and solid particle invasion. Therefore, by comparing data from the two sensors one could draw conclusions about the quality of the log obtained. Both absolute and relative magnitudes of the parameters would have to be taken into consideration in arriving at a log quality indicator.

For instance, two parameters that are available in real time are the amplitude and decay time constant $T_2$ of the received spin echo decay curve. If the data from both sensors are nearly the same one would assume that all data are valid. If the shallow amplitude approaches 100 percent porosity one would conclude that the shallow sensor 18 is corrupted by excessive standoff or mudcake. If the shallow $T_2$ is significantly faster than the deep $T_2$ this would indicate that the shallow data is probably affected by solid particle invasion or mudcake. This situation could also result if the flushed zone has not progressed to the sensitive region of the deeper sensor. A difference threshold is therefore employed to differentiate these two possibilities. If the shallow amplitude is only somewhat higher than the deep and the shallow $T_2$ is faster there is probably some drilling-induced formation damage, for example due to fracturing.

A third parameter that could be compared from the sensor outputs is the NMR permeability which is calculated from both the amplitude and decay time measured by each sensor. For a typical log both permeabilities should be the same. A shallow sensor reading of permeability which is significantly different than the deep sensor reading of permeability would indicate that the shallow sensor may be influenced by mudcake, borehole fluid invasion, borehole washout or borehole fracturing. The two permeability measurements would also be used to remove some of the ambiguity when just the amplitude and T2 parameters are compared from each sensor.

In the preferred embodiment of the invention the following two relationships are preferred to indicate acceptable results from sensor 18:

shallow amplitude-deep amplitude $<\pm 2*$Sigma-P; represented by quality indicator index 1 in FIG. 1, where Sigma-P is the deep measurement's porosity precision, typically 1 porosity unit; and shallow $T_2-$deep $T_2 < \pm 2*$Sigma-T; represented by quality indicator index 2 in FIG. 1, where Sigma-T is the deep measurement's T2 precision typically 5 to 20 milli-seconds.

Both Sigma-P and Sigma-T are a function of logging speed and other tool parameters and may therefore be different for different tool and magnet configurations. They may be further determined experimentally.

When either of these relationship does not hold true the appropriate index provides an appropriate indication. For example, the presentation of the indicators may take on a binary form; e.g., 1 or 0 for the respective states. Other forms of continuous presentations for the indicators may be readily arrived at including incremental representations of, for example, the magnitudes of divergence of the measurements as a continuous function of depth.

The electronics requirements for the tool 13 may be mounted in the body 27 or in a separate cartridge or sonde. The preferred circuitry, shown for only the magnet array 17, is shown schematically in FIG. 4 and operates in three modes: transmitting, damping, and receiving. The preferred circuitry for the magnet array 20 is similar to that for the magnet array 17.

Figure 4:
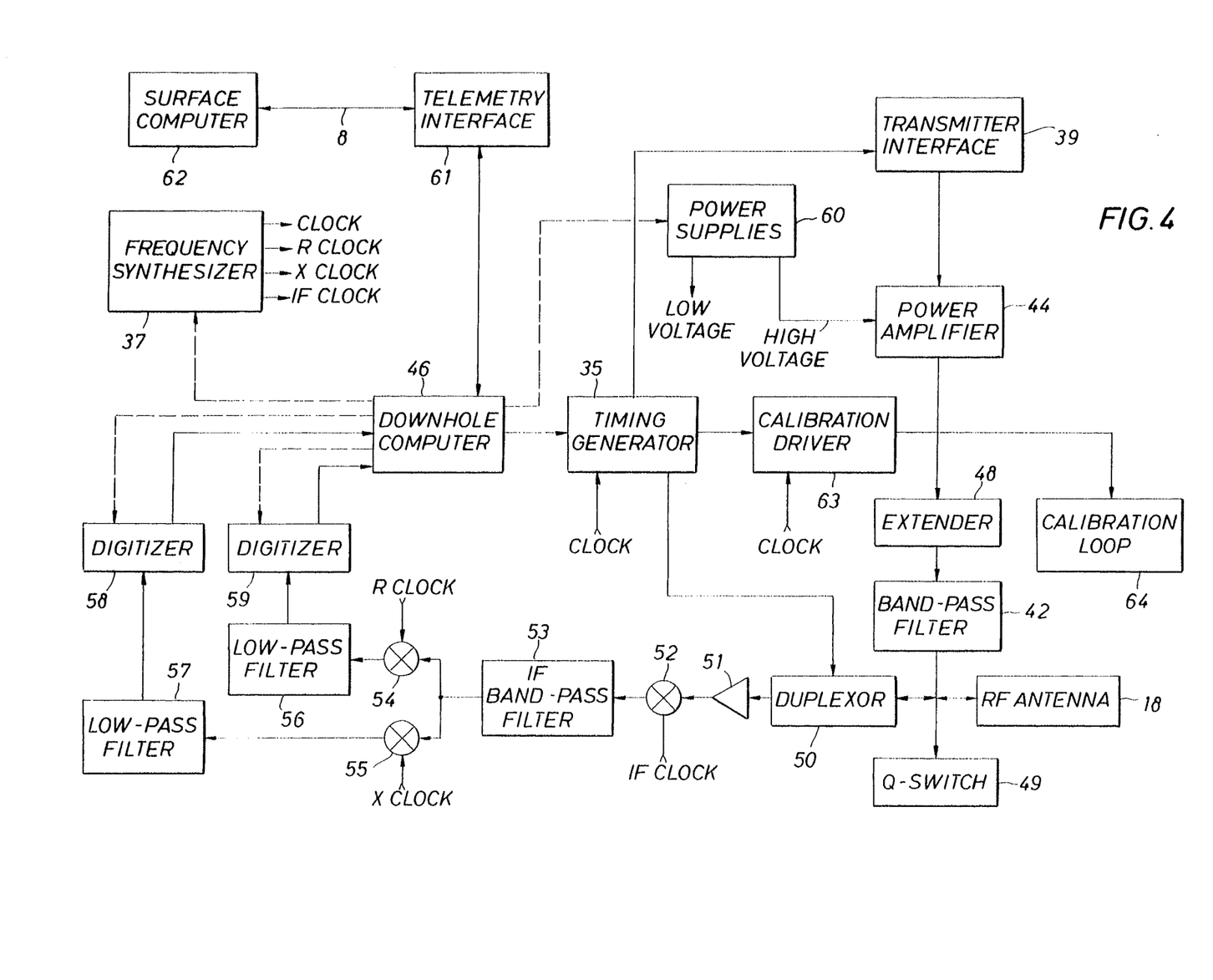
FIG. 4 is a block diagram of circuitry preferably contained in the tool of FIG. 1.

Referring to FIG. 4, the system timing controlled by the controllable frequency synthesizer 37, under the direction of the downhole computer 46. This synthesizer 37 generates all timing signals used in the system and is capable of a range of frequencies under the direction of the computer 46. This feature is important in a borehole NMR apparatus as the frequency must be changed to accommodate changes in the static field strength generated by the permanent magnets e.g., 24,26, with changing temperature.

The transmitting circuitry is comprised of the transmitter interface 39, the power amplifier 44, the extender 48 and the bandpass filter 4. The appropriate timing and phase of the pulse to be demonstrated is loaded from the downhole computer 46 to the timing generator 35 which controls all aspects of timing in the tool. The timing generator 35 sends the selected RF pulse sequence to the transmitter interface 39 which in turn drives the power amplifier 44 to generate the high power RF pulses required by the NMR measurement. The transmitter interface 39 also can disable the drive to the power amplifier 44, under the control of the downhole computer 46, when the system is in receive mode to help reduce spurious signals from reaching the antenna 18 during receive mode.

The power amplifier 44 generates the high voltage RF pulses required by the measurement, using the high voltage from the computer controlled power supply 60. The extender 48 further protects the antenna 18 from spurious signals from the power amplifier 44 during receive mode. Band-pass filter 43 rejects harmonics assuring that the spectral composition of the RF pulse is pure.

The RF pulses fed to the antenna 18, radiate a pulse of magnetic field B1 to resonate nuclear spins in the formation. In between transmitting pulses, the system is put into receive mode, and duplexor 50 receives the oscillating magnetic signals of nuclear spin precession from antenna 18.

The received signal is passed through the preamp 51 to the IF stage which consists of the IF mixer 52 and IF band-pass filter 53. The detected and amplified signal is frequency translated from the original RF frequency of approximately 2 MHz to the IF frequency of approximately 250 KHz by the process of mixing the amplified signal of 2 MHz with the IF clock 1.75 MHz, generated by the frequency synthesizer 37. The IF signal out of the band pass filter 53 is then passed to the quadrature detection system.

The quadrature detection system consists of mixers, 54 55, whose reference signals R Clock and X Clock are in quadrature i.e., 90 degree phase shift between the two and low pass filters 56 and 57. In quadrature detection the amplitude of the original unknown, but fixed, phase signal can be recovered by using the quadrature R and X signals. This is a critical feature of the design, as, unlike a laboratory instrument, it is impossible to determine a priori the phase of the detected signal. Reference may be had for details of such a system to co-pending U.S. application Ser. No. , filed in the name of Robert Freedman of even date and commonly owned with this application. The disclosure of said co-pending application is hereby incorporated by reference.

The R signal mixer 54 mixes the IF signal from the IF band pass filter 54 with the R clock reference of 250 KHz from the synthesizer 37. This is a base band mixer, the carrier signal is removed and only the pulse remains after passing through the low-pass filter 56.

A nearly identical process occurs in the X channel with the necessary difference that the X clock is 90 degrees shifted from the R clock. The signals from both low pass filters 56,57 are passed to the computer controlled digitizers 58,59. The digitizing process is controlled by the downhole computer 46. The digitizers each first integrates the pulse envelopes and the converts the integrated amplitude to a digital number to be read by the downhole computer 46.

These digitized amplitudes are then sent via the telemetry interface 61 to a surface computer 62 for final processing into the petrophysical parameters of interest. The surface computer 62 forms a part of the surface equipment 7 of FIG. 1.

An additional feature of the design is the calibration system which consists of the calibration driver 63 and the calibration loop 64. Under control of the timing generator 35 and the downhole computer 46 the calibration driver 63 generates a constant current with temperature and frequency RF source which is used to drive a small loop antenna 64 mounted near the RF antenna 18. This signal is detected by the RF antenna and used to correct for temperature and fluid conductivity effects on the system gain.

In the transmitting mode, the transmitting circuitry must generate a large power output of about 1 kilowatt at a frequency on the order of 2 MHz for a short, precisely timed period, shut off this current very quickly, within about 10 microseconds, and then isolate any signals or noise of the power circuits from coupling with other detection circuitry within the tool 13.

The receiving system of RE antenna and matching circuit is designed to have a high Q to maximize the S/N ratio. In such a high Q system, the antenna tends to ring for an undesirably long time, and causes undesirable magnetic spin tipping in the formation. If the antenna is permitted to ring uncontrollably, the transmitted magnetic field pulse bandwith may be substantially reduced. In order to minimize the antenna ringing problem, a Q switch 49 is connected to the line between extender 48 and antenna 18 as a preferred means for damping antenna ringing very quickly at the end of a transmitted pulse. The Q switch 49 closes a circuit at the appropriate time, which changes the impedance of the RF antenna system including RF antenna 18 so that the system is critically damped, and the ringing energy quickly dissipated.

During the receiving mode of operation, Q switch 49 is switched off, and signals from precessing nuclei are received by RF antenna 18 and passed through the duplexer 50 to the receiver amplifier 51. Duplexer 50 protects the receiver amplifier 51 from the high power pulses which pass from power amplifier 44 47 to the RF antenna 18 during the transmitting mode. During the receiving mode, duplexer 50 is effectively just a low impedance cable (about 50 ohms) connecting the antenna 18 to receiver amplifier 51.

During operation of the tool 13, the operator enters into the computer 46 information respecting the type of measurement sequence to be taken. Computer 46 then sets the sequence of electronic steps needed for the equipment to implement the measurement sequence. The computer 46 controls the frequency synthesizer 36 and timing generator 40 which in turn sends control signals to the various components of circuit 35 to control the polarizing pulse height, length, frequency, relative phases of sequential pulses, receiving mode period and frequency, and the timing of all of the above.

Because the high Q antenna 18 can be rapidly damped after transmitting a 1 kilowatt RF pulse, the tool 13 is capable of resonating a targeted formation 12 with successive pulses in a short time with a deadtime between a transmitted pulse and the commencing of the receiving mode within microseconds. Using peak power of 1 KW, the pulses can have a duration of about 40 microseconds and it is possible to have as many as thousands of pulses within a measurement cycle lasting many seconds.

When the tool 13 is used to make continuous logs, without stopping the tool for each measurement, an alternative embodiment may be preferred to further improve the signal-to-noise ratio beyond what has already been discussed. Referring to FIG. 1, a prepolarizing magnet 23 is installed within the tool 13 above the position of the main magnet array 17, to magnetically prepolarize the formation before the magnet array 17 has reached proximity to it for measurement. The field of the prepolarizing magnet 23 should be similar to that of the magnet array 17 in orientation, but preferably much stronger, so as to polarize a much larger population of nuclei. As the tool is moved up the borehole, magnet array 17 comes into proximity of formation 11, and radiates it with RF pulses. However, because of the prepolarization, a larger number of nuclei are aligned with the field $B_0$ of the magnet array 17 within the volume of substantially homogeneous field, and a correspondingly larger signal is produced.

What is claimed is:

1. A nuclear magnetic resonance apparatus for investigating properties of an earth formation traversed by a fluid filled borehole, comprising:

an elongated body;

first means, supported on said body, for producing a static magnetic field in a first volume of said formation at a first lateral distance into the formation when said body is at a given location in the borehole;

second means, supported on said body, for simultaneously producing a static magnetic field in a second volume of said formation at a second lateral distance, different from said first distance, into the formation when said body is at said given location in the borehole;

means for radiating said first and second volumes of the formation with oscillating magnetic fields sufficient to cause nuclear magnetic precession in a population of particles in said formation in each of said volumes and for detecting signals representative of the resulting nuclear magnetic precession;

means responsive to the signal representative of nuclear magnetic precession for providing output indications of properties of the formation in each of said two volumes; and means for comparing said output indications to determine effects of borehole fluid invasion on said output indications.

2. The apparatus of claim 1, wherein said first means comprises an elongated permanent magnet with the axis of magnetization being in a direction transverse to the axis of elongation and wherein said second lateral distance is greater than said first lateral distance.

3. The apparatus of claim 2, wherein said second means comprises a pair of elongated permanent magnets with the axis of magnetization for each magnet being in a direction transverse to the axis of elongation, and the axes of magnetization of said pair of magnets of said second means being aligned along intersecting lines.

4. The apparatus of claim 1 further comprising means for deriving a record of said output indications correlated to the depth of said body in the borehole at the time of detection.

5. The apparatus of claim 4 wherein said radiating means is operable both to produce oscillating magnetic fields and to detect signals representative of nuclear magnetic precession in said formation; and wherein said comparing means includes means for combining said detected signals to derive an improved investigation of said formation's characteristic.

6. An apparatus for geophysical examination of a fluid filled borehole comprising:

a carriage;

first means, supported on said carriage, for producing a static and substantially homogeneous magnetic field in: 1) a first volume at a first lateral distance from said carriage, and 2) in a second volume at a second lateral distance from said carriage;

said second lateral distance being greater than said first lateral distance;

means for radiating said first and second volumes with oscillating magnetic fields and for detecting signals representative of nuclear magnetic precession of a population of particles in each of said volumes; and means for comparing the signals representative of nuclear magnetic precession of a population of particles in each of said volumes respectively to determine effects of borehole fluid invasion on said first volume.

7. The apparatus of claim 6, wherein said first means comprises an elongated permanent magnet with the axis of magnetization being in a direction transverse to the axis of elongation.

8. The apparatus of claim 7, wherein said first means further comprises a pair of elongated permanent magnets with the axis of magnetization for each magnet being in a direction transverse to the axis of elongation, and the axes of magnetization of said pair of magnets being aligned along intersecting lines.

9. The apparatus of claim 7, wherein said radiating means includes a directional antenna.

10. The apparatus of claim 8 wherein said radiating means includes a directional antenna supported on said carriage.

11. The apparatus of claim 6 wherein said radiating means includes:

a directional antenna supported on said carriage;

means for providing said antenna with radio frequency pulses including means for controlling the shape and frequency of said pulses; and means for damping said antenna after each of said pulses.

12. The apparatus of claim 11 further comprising means for suspending said carriage in said borehole by means of a cable and applying said body against the wall of said borehole.

13. A method of investigation by means of nuclear magnetic resonances techniques the earth formation surrounding a fluid filled borehole, comprising the step of:

producing a static and undirectional magnetic field in a region of the formation adjacent to said borehole and laterally disposed relative to the borehole;

radiating said region with oscillating magnetic fields;

simultaneously detecting signals representative of nuclear magnetic precession of a population of particles in two laterally separated volumes within said region; and means for comparing signals representative of nuclear magnetic precession of a population of particles in each of said volumes to select those signals which are less affected by borehole fluid.

14. The method of claim 13, wherein said step of producing a static magnetic field comprises the use of a pair of elongated permanent magnets with the axis of magnetization for each magnet being in a direction transverse to the axis of elongation.

15. The method of claim 14, wherein said radiating step comprises the use of a directional electromagnetic radiation source.

16. The method of claim 15 further comprising the step of deriving a record of said output indications correlated to the depth in the borehole at the time of detection.

17. A method for well logging using nuclear magnetic resonances and comprising the following steps:

generating a static magnetic field having a direction substantially perpendicular to the axis of a borehole in a region in earth formations surrounding the borehole which region includes material sought to be analyzed;

generating a radio frequency magnetic field in said region in a direction substantially perpendicular to a plane containing both the axis of the borehole and the static magnetic field direction for exciting nuclei of the material sought to be analyzed;

simultaneously receiving nuclear magnetic resonance signals from the excited nuclei in two laterally separated volumes within said region, said lateral separations being at different distances relative to said axis of said borehole, and providing as output indication of properties of the material sought to be analyzed on the basis of the received nuclear magnetic resonance signals.

18. A method according to claim 17 and wherein said step of generating a static magnetic field includes generating a static magnetic field having a magnetic field amplitude gradient which extends substantially radially with respect to the axis of the borehole.

19. A method according to claim 18 and wherein said step of generating a static magnetic field includes the step of generating a static magnetic field in a region to one side of said borehole.

20. A method according to claim 17 and comprising the steps of generating a static magnetic field, generating a radio frequency magnetic field and receiving nuclear magnetic resonance signals at a plurality of locations along a borehole, thereby to enable a plurality of nuclear magnetic resonance measurements to be carded out therealong.

21. A method according to claim 20 and also comprising the step of selectably varying the frequency of said radio frequency magnetic field.

22. An apparatus for nuclear magnetic resonance sensing comprising:

means comprising no more than two elongated magnets for generating a static magnetic field in a region remote from said two magnets, said region including materials sought to be analyzed;

means including at least one antenna and associated electronic circuitry for: 1) generating a radio frequency magnetic field in said region for exciting nuclei of materials sought to be analyzed, and 2) receiving nuclear magnetic resonance signals from the excited nuclei; and a generally cylindrical metallic housing for carrying said two magnets and said antenna, said housing having an elongation axis; wherein:

said static magnetic field is generated such that in said region the magnetization direction of said static field is substantially perpendicular to the elongation axis;

said two elongated magnets are carried side by side within said housing exclusive of an interior section about the elongation axis; and said radio frequency magnetic field's magnetic field direction is substantially perpendicular to said static magnetic field magnetization direction in said region.

23. Apparatus as claimed in claim 22, wherein said housing includes means for its support within a borehole such that said region includes earth formations to be investigated.

24. Apparatus as claimed in claim 23, further comprising means for displacing said housing along said borehole, thereby enabling a plurality of nuclear magnetic resonance measurements to be carried therealong and a log of such measurements made.

25. Apparatus as claimed in claim 22, wherein said at least one antenna is carried on said housing in an eccentered position relative to said elongation axis.

26. Apparatus as claimed in claim 25, comprising means for selectively varying the frequency of said radio frequency magnetic field.

* * * * *